United States Patent
Nazarian

(10) Patent No.: US 6,552,519 B1
(45) Date of Patent: Apr. 22, 2003

(54) VARIABLE IMPEDANCE NETWORK FOR AN INTEGRATED CIRCUIT

(75) Inventor: Hagop A. Nazarian, San Jose, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/989,874

(22) Filed: Nov. 20, 2001

(51) Int. Cl.⁷ .................................. H02J 3/12
(52) U.S. Cl. .................. 323/354; 323/297; 323/298; 341/121; 341/144; 341/154; 341/159
(58) Field of Search ................ 323/293, 297, 323/298, 352, 353, 354, 364, 369, 299; 341/154, 159, 121, 144

(56) References Cited

U.S. PATENT DOCUMENTS

| | | | | |
|---|---|---|---|---|
| 3,590,366 A | * | 6/1971 | Vaughn et al. | 323/354 |
| 4,157,494 A | * | 6/1979 | Kornienko et al. | 323/349 |
| 4,468,607 A | | 8/1984 | Tanaka et al. | |
| 4,810,949 A | * | 3/1989 | Schiemenz et al. | 323/354 |
| 4,849,903 A | * | 7/1989 | Fletcher et al. | 323/354 |
| 5,084,667 A | * | 1/1992 | Drori et al. | 323/298 |
| 6,002,354 A | * | 12/1999 | Itoh et al. | 341/144 |
| 6,127,893 A | * | 10/2000 | Llewellyn et al. | 330/254 |
| 6,307,490 B1 | * | 10/2001 | Litfin et al. | 341/121 |
| 6,331,768 B1 | * | 12/2001 | Drori et al. | 323/297 |

* cited by examiner

*Primary Examiner*—Michael Sherry
*Assistant Examiner*—Gary L. Laxton
(74) *Attorney, Agent, or Firm*—Blakely, Sokoloff, Taylor & Zafman LLP

(57) ABSTRACT

A variable impedance network for the use in building potentiometers and digital-to-analog converters (DAC) is disclosed. The impedance network is constructed such that it reduces the overhead circuits associated with it compared to conventional approach. The percent reduction of overhead circuitry including the wiper transistors increases exponentially as the number of the taps required for the potentiometer increases.

20 Claims, 6 Drawing Sheets

(PIROR ART)**

VARIABLE IMPEDANCE NETWORK FOR AN INTEGRATED CIRCUIT

BACKGROUND

1. Field of the Invention

The present invention relates to variable impedance networks. More particularly, the invention relates to such variable impedance networks for use in integrated circuits.

2. Prior Art

Variable impedance networks are usually manually adjusted to provide a selected impedance so as to affect some aspect of the circuit in which the networks are located. These variable impedance networks are usually in the form of variable resistors, also called potentiometers. However, circuits using variable inductors or capacitors may also be formed.

Manual adjustment of potentiometers is usually undesirable in circuits under the control of data processing systems or other external electric circuits where ongoing adjustment of the potentiometer is necessary for circuit operation. The data processing system often must change the value of the variable impedance network in a time that is short relative to the time required to complete a manual adjustment of the variable impedance element. Therefore, special purpose integrated circuit variable impedance networks have been employed in the prior art. These networks allow the level of attenuation to be adjusted under the digital control of an external data processing system.

For example, Tanaka, et al., U.S. Pat. No. 4,468,607, teaches a ladder attenuator which is controlled by a binary number by means of a switch circuit. Depending on the stage of the switches in this switch circuit, one or more stages of attenuation are introduced into the signal path. However, teachings of Tanaka may require a large number of fixed impedance elements and switches for a large range of impedances. Accordingly, Drori, et al., U.S. Pat. No. 5,084,667, suggests a number of embodiments of variable impedance elements which minimizes the number of separate resistors required to achieve the equivalent resolution achievable using a series arrangement of resistors.

SUMMARY

The present invention, in one aspect, describes an impedance network having a pair of end terminals, a wiper terminal, and a first plurality of impedance elements. The wiper terminal provides a tap position at a selected impedance value of the impedance network, selectable at a specified increment value. The first plurality of impedance elements is operatively configured to provide a range of impedance values with less number of wiper switching elements than for an impedance network with impedance elements having a uniformly selected increment value.

In another aspect, the present invention describes a method for configuring an impedance network. The method includes first configuring a first plurality of resistors selectively connectable in parallel. A second plurality of resistive elements is then connected in series, where each resistive element includes equivalent resistance formed by the first plurality of resistors. The second plurality of resistive elements is configured into a mirrored configuration with respect to a center of the network. Nodes of the second plurality of resistive elements are then selectively connected to a wiper terminal of the impedance network.

DETAILED DESCRIPTION

In recognition of the above-stated challenges associated with prior art designs of variable impedance networks, the present invention describes alternative embodiments for a variable impedance network which reduces overhead circuits including wiper transistors. Consequently, for purposes of illustration and not for purposes of limitation, the exemplary embodiments of the invention are described in a manner consistent with such use, though clearly the invention is not so limited.

Figure 1A:
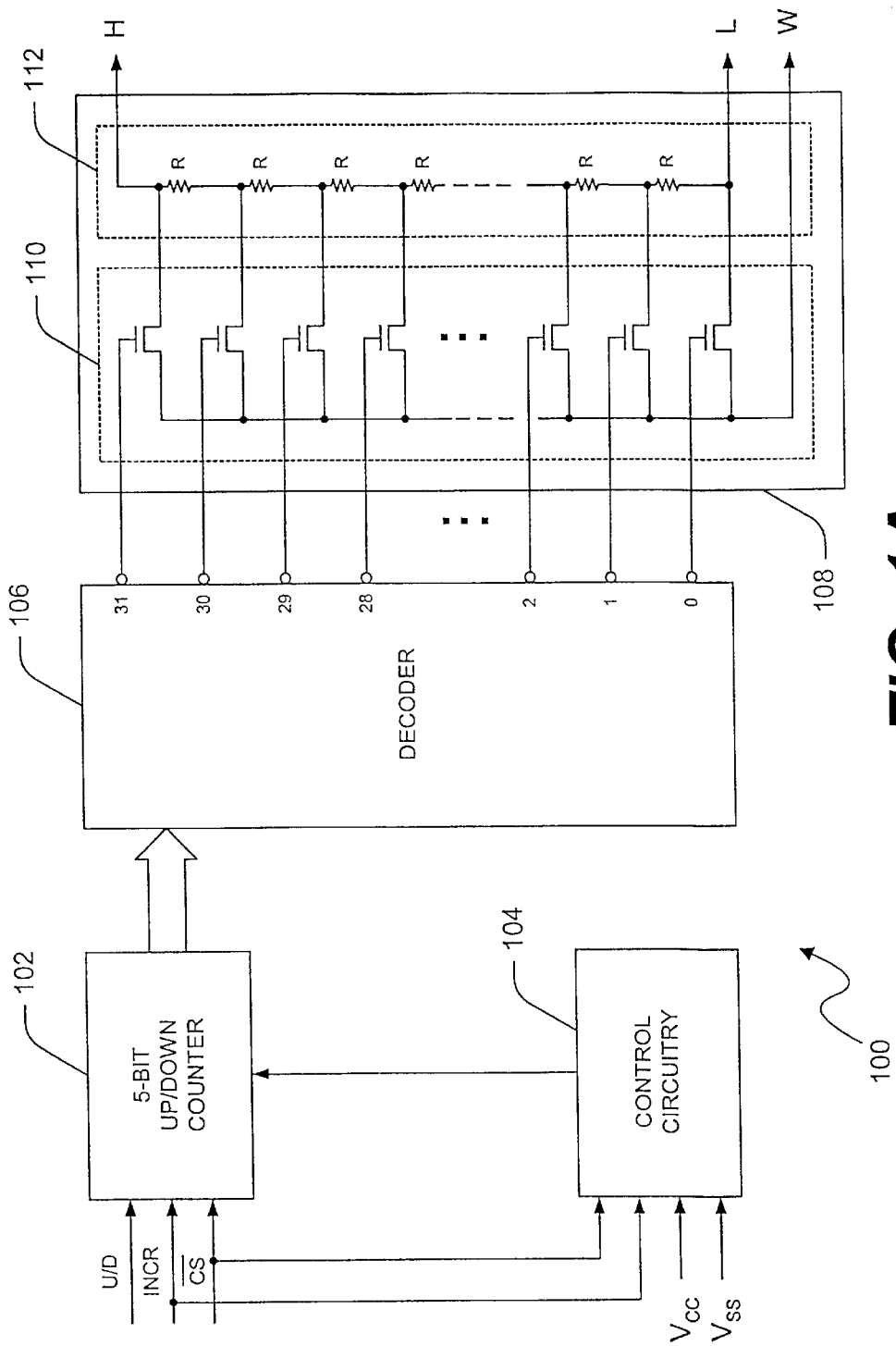
FIG 1A shows a conventional variable resistance network.

A conventional variable resistance network 100 is illustrated in FIG. 1A. The network 100 includes a counter 102, a control circuitry 104, a decoder 106, and a network array 108 having a transistor array 110 and a resistor array 112. In the illustrated example, the network array 108 has three terminals, H, L and W. Hence, the network array 108 simulates a standard potentiometer 120, such as the one shown in FIG. 1B. Terminals H and L correspond to the end terminals, while terminal W corresponds to the center tap of the potentiometer 120.

In the illustrated example of FIG. 1A, the resistor array 112 includes 32 equal resistor elements (R) arranged in series to represent 32 tap positions at the wiper nodes of the potentiometer 120. However, any number of resistor elements may be used to provide smaller or larger resistance value than this example. The transistor array 110 includes wiper transistors that are used to connect various combinations of resistor elements between two terminals H and W.

The particular combination is determined by a value stored in a counter 102, which may be altered by two signals, U/D and INCR. The U/D signal determines whether the counter 102 will be incremented or decremented by a predetermined amount in response to the increment (INCR) signal. This value is coupled to a 1-of-N decoder 106, where N=32. The output of this decoder 106 controls the plurality of wiper transistors in the transistor array 110. Since N is the maximum value which may be stored in the counter 102, there are N nodes in the resistor array 112, each node corresponding to a given counter value. Each node may be coupled to terminal W by applying a signal to the corresponding wiper transistor in the transistor array 110.

The value stored in the counter 102 may be transferred to a memory in the control circuitry 104 in response to specified voltage transitions on a chip select (CS) line. The chip select line also enables the counter 102. When the chip select line is low, the counter 102 responds to signals on U/D and INCR lines. This enables the circuit controlling the variable resistance network 100 to alter the value stored in counter 102.

The control circuitry 104 also monitors supply voltages ($V_{CC}$ and $V_{SS}$) to load the value stored in the memory into the counter 102 when power is applied to the variable resistance network 100. This ensures that the last value stored in counter 102 before power was removed from the variable resistance network 100 will be restored when the power is once again applied to the variable resistance network 100.

Figure 1B:
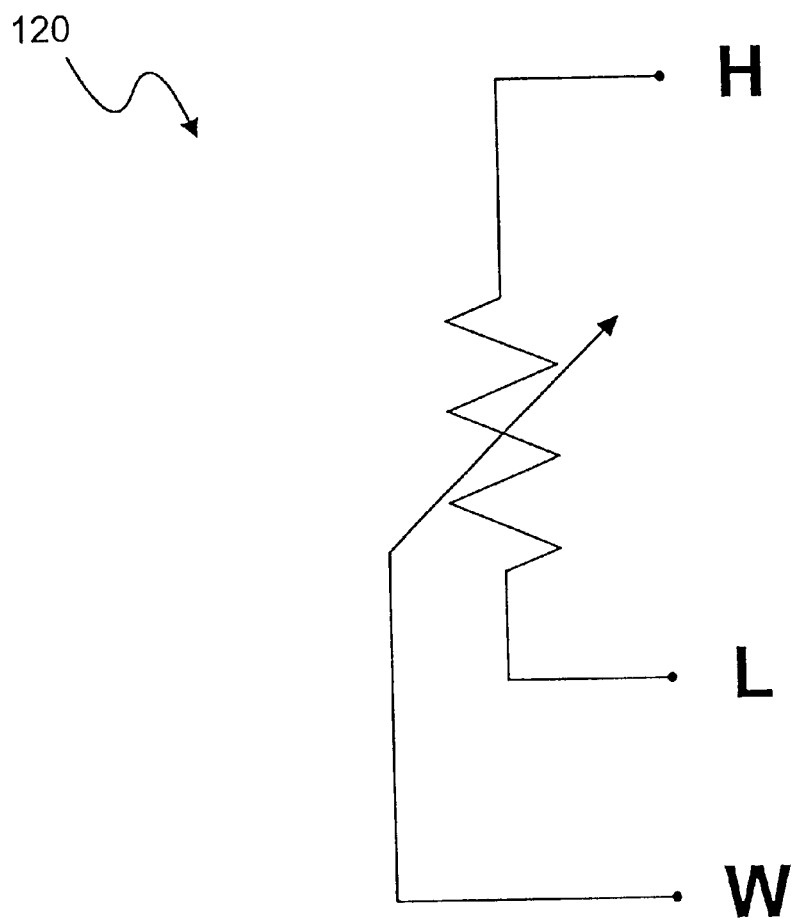
FIG. 1B shows a standard center-tapped potentiometer.

With the above-described approach illustrated in FIGS. 1A and 1B, N wiper transistors are required to generate N tap positions. Hence, when N becomes large (e.g., N>100), the area of the die occupied by the wiper transistors may significantly increase, especially when the specification for wiper resistance is low (i.e., 50 ohms or less).

Accordingly, the present embodiments include solutions to the above-stated undesirable outcome of large N by providing a variable impedance network which requires fewer wiper transistors. Moreover, the teachings of these embodiments may be extended to include impedance networks having elements other than resistors, such as capacitors or inductors. In the below-described embodiments, the impedance network is a binary numbering scheme assigned to a plurality of serially connected resistive pairs, where each pair is connected in parallel. However, in an alternative embodiment, more than two resistors may be configured in parallel arrangement to provide wider range of resistance values, and thus, further reduce the wiper transistor count. In a further embodiment, bypass transistors may be provided to bypass certain resistors. This may also provide wider range resistance values.

Figure 2:
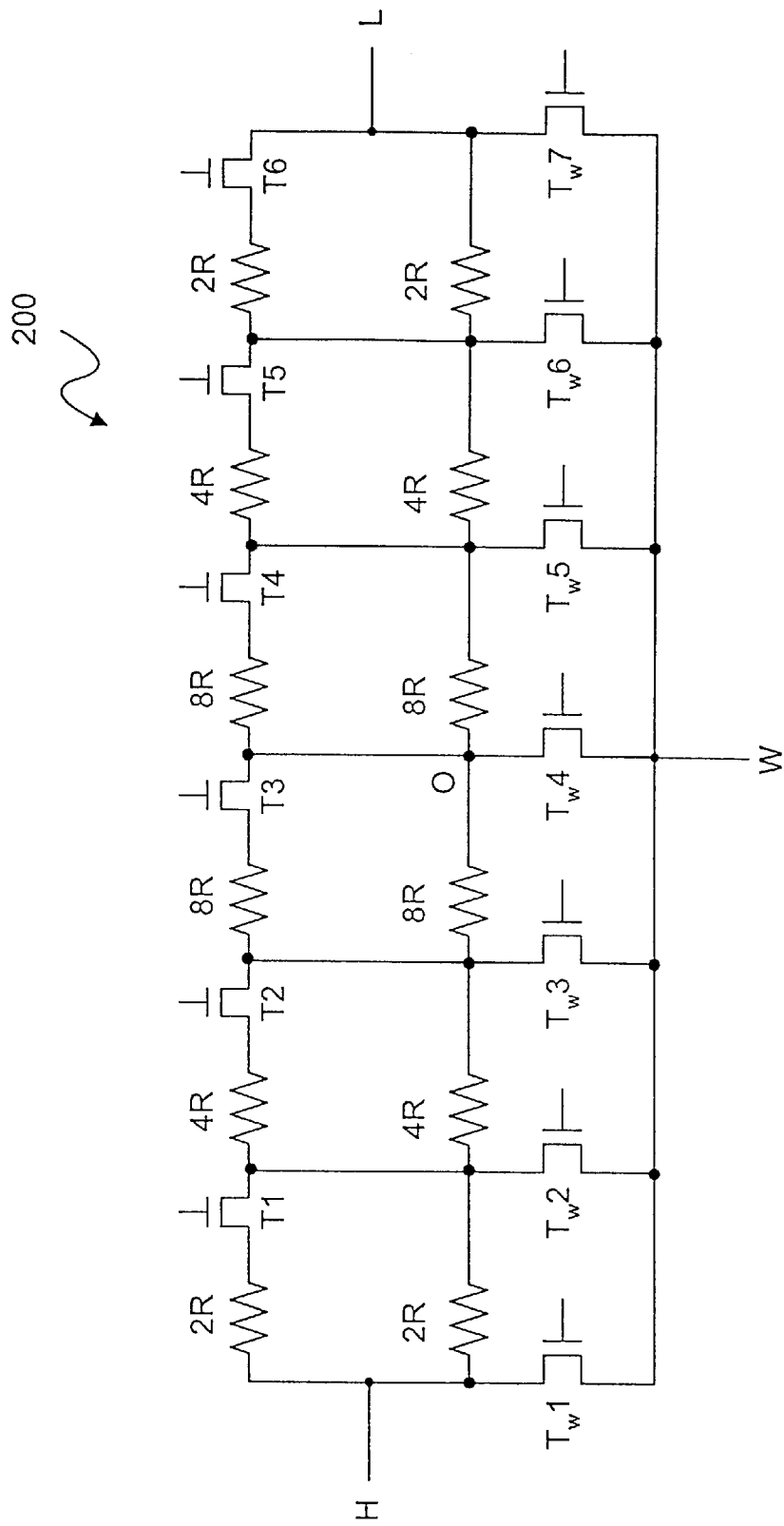
FIG. 2 illustrates an impedance network array configuration according to an embodiment of the present invention.

An impedance network array configuration 200 according to an embodiment of the present invention is illustrated in FIG. 2. In the illustrated embodiment, the network array 200 is configured into a plurality of serially connected resistor pairs, where each pair is connected in parallel. In this embodiment, the plurality of serially connected resistor pairs is connected with connection nodes. Resistance values of the resistor pair connected in parallel are equal. In the illustrated embodiment, a switching element, such as a transistor, may be connected in series with one resistor of the resistive pair to either provide that resistor in parallel or to disconnect that resistor. In particular, the transistor may be a field-effect transistor (FET). Resistance values of the plurality of serially connected resistor pairs may be different. In the illustrated embodiment, the resistance values of the plurality of serially connected resistor pairs are mirrored with respect to the center node, O. Furthermore, each resistor pair is selectively connected to the wiper terminal (W) through a switching element such as a transistor to select different combinations of series resistances. In particular, the transistor may be a field-effect transistor (FET).

Further, the impedance network array configuration 200 is arranged to meet two constraints. The first constraint is to keep the end-to-end resistance of the array (i.e., potentiometer) 200 constant. This constraint for constant end-to-end resistance between the end terminals H and L must be followed to ensure proper functioning of the potentiometer. The second constraint is to generate all possible taps at the variable node of the potentiometer, with each tap providing a unit resistance (R). Therefore, a 21R end-to-end resistance potentiometer with 22 1R taps may be configured as shown in FIG. 2.

To accomplish the first constraint, the binary sequence is mirrored around the center node O so that any resistance between H and W is complemented with a resistance between W and L that keeps the end-to-end resistance constant to 21R. For example, if 1R (i.e., 2R∥2R, where ∥ indicates parallel configuration) is selected on the H-to-W side by turning on transistors T1 and $T_W2$, a 20R resistance must be selected with the rest of the resistor array on the W-to-L side by turning on T2 and T3. This generates a 20R configured by (4R∥4R)+(8R∥8R)+8R+4R+2R=2R+4R+8R+4R+2R. In the illustrated embodiment, transistors labeled TX, where X is between 1 and 6, are referred to as pass transistors. Transistors labeled as $T_WX$, where X is between 1 and 7, are referred to as wiper transistors. Thus, the pass transistor allows resistors into parallel configuration, while the wiper transistor allows incorporation of each series resistance to be applied.

The second constraint to achieve all minimum increment (R) taps may be ensured by determining the end-to-end resistance using the following formula:

$$R_{end-to-end} = R_{max} + R_{min},$$

where $R_{max}$ is the maximum resistance that may be configured up to the center (labeled as O in FIG. 2) of the network array 200 (i.e., configured with one-half of the network array); and $R_{min}$ is the minimum resistance that may be configured up to the center (labeled as O in FIG. 2) of the network array 200.

In the illustrated embodiment of FIG. 2, $R_{max}$ is 14R and $R_{min}$ is 7R. Hence, in this configuration, $R_{min}=R_{max}/2$. Furthermore, $R_{end-to-end}=14R+7R=21R$. This end-to-end resistance satisfies the two constraints and generates all the possible 22 taps for the 21R potentiometer 200. Accordingly, 1R is achieved, for example, on the H-to-W side by turning on transistors T1 and $T_W2$. This requires 20R on the rest of the network array on the W-to-L side by turning on transistors T2 and T3. 2R is achieved on the H-to-W side by turning on transistor $T_W2$. This requires 19R on the rest of the network array on the W-to-L side by turning on transistors T2, T3, and T6. Furthermore, 3R is achieved on the H-to-W side by turning on transistors T1, T2, and $T_W3$. This requires 18R on the rest of the network array on the W-to-L side by turning on T3. Similar arrangements may be configured to provide the rest of the resistance values from 4R to 21R, at an increment of 1R.

Figure 3:
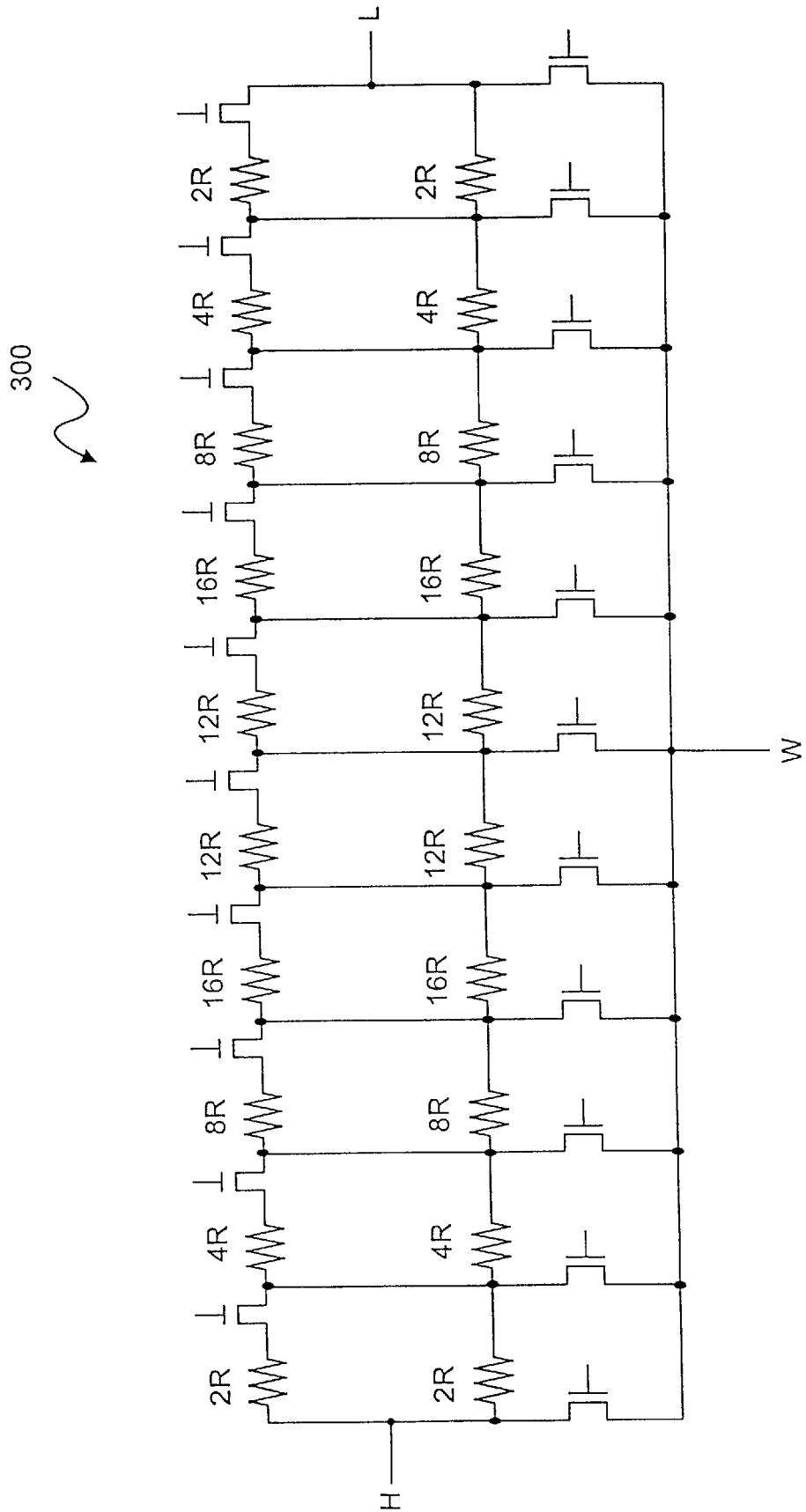
FIG. 3 illustrates a resistor network configuration for 64-tap potentiometer in accordance with an embodiment of the present invention.

Table 1 shows resistor network configurations for 64, 128, and 256 tap potentiometer configurations, and their resistance construction values and sequence. Although the table shows only three configurations, further configurations with any number of steps may be arranged similarly. As an example, FIG. 3 illustrates a resistor network configuration 300 for 64-tap potentiometer in accordance with an embodiment of the present invention.

TABLE 1

| Total Step | $R_{TOTAL}$ | $R_{MIN}$ | $R_{MAX}$ | Network Configuration |
|---|---|---|---|---|
| 64 | 63R | 21R | 42R | 2R, 4R, 8R, 16R, 12R, 12R, 16R, 8R, 4R, 2R |
| 128 | 127R | 41R | 86R | 2R, 4R, 8R, 16R, 32R, 24R, 24R, 32R, 16R, 8R, 4R, 2R |
| 256 | 255R | 85R | 170R | 2R, 4R, 8R, 16R, 32R, 64R, 44R, 44R, 64R, 32R, 16R, 8R, 4R, 2R |

As described above, the present embodiments provide advantages over the conventional network configuration by requiring fewer wiper transistors. The conventional method scales linearly with the number of taps. The method requires N+1 wiper transistors for N needed taps. However, the new method of the present embodiments scales logarithmically with the number of taps. The new method uses [ln(N)/ln(2)−1]*6+1 wiper transistors for N needed taps.

Table 2 shows difference between the resources used by the conventional approach of FIG. 1 compared to the new approach of FIGS. 2 through 5. One of the advantages of the new approach includes significantly reducing the number of required wiper transistors compared to the conventional approach. This reduction further provides reduction of effective parasitic capacitor induced by the wiper transistors. Moreover, this also increases the frequency response of the potentiometer. The new approach, however, requires more unit size resistors than the conventional approach. Specifically, the new approach uses 2.66 times (i.e., (4 quadrant)*(⅔ of total resistance)*(N−1 minimum number of resistors)) more unit size resistors than the conventional method. More unit size resistors are needed because N-ohm resistor used in the new approach requires N unit size resistors. Thus, for example, although only 12 resistors are shown in the network of FIG. 2, 56 unit size resistors are required since those 12 resistors combine to a total of 56R. However, since the unit size resistors are not a major area contributor to the die size, the impact of the increase in the unit size resistors may be overcome by the reduction of the wiper transistor overhead, especially for potentiometers with a large number of taps.

Figure 4:
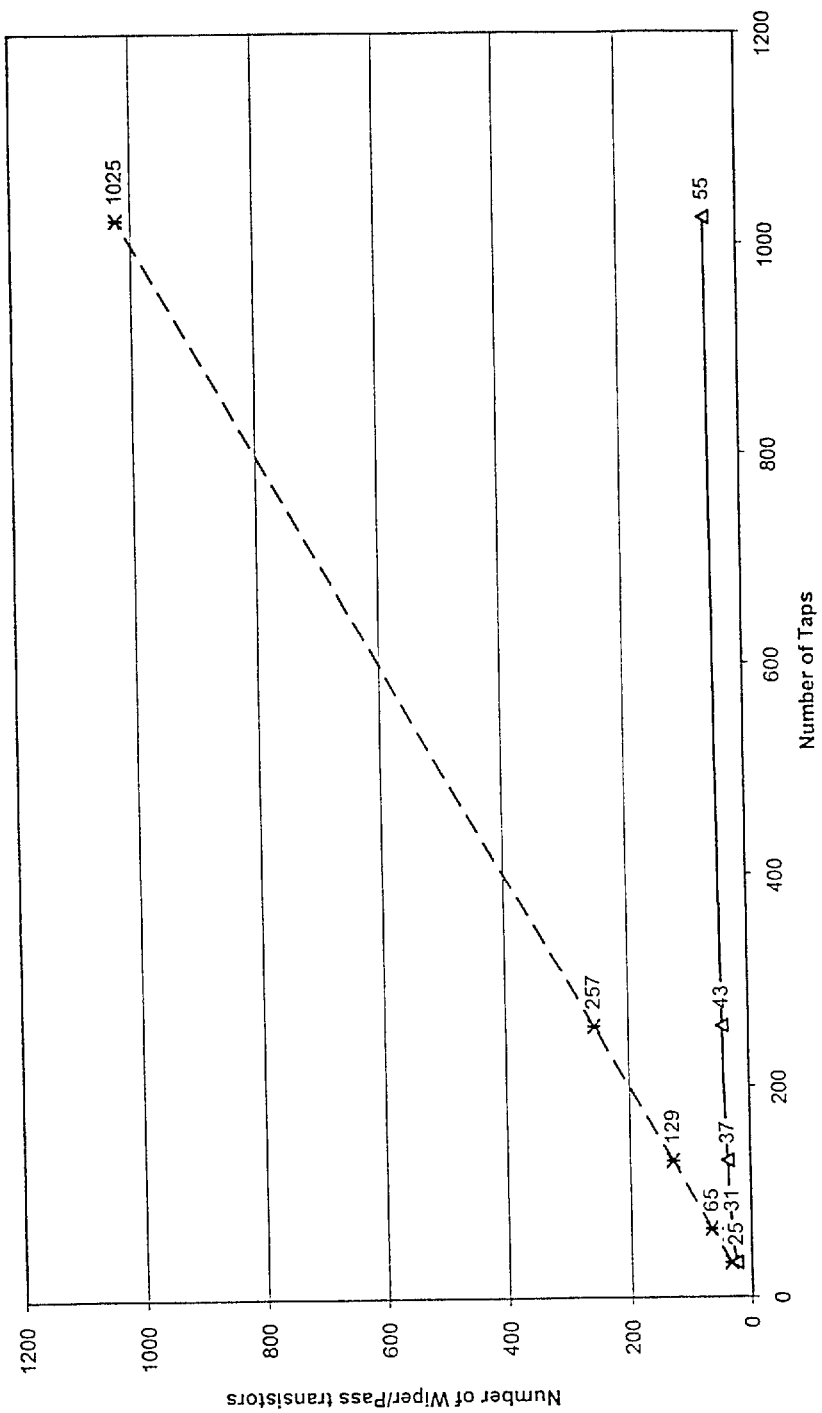
FIG. 4 shows a graph comparing the number of wiper transistors used in the conventional approach to the number of wiper transistors used in the new approach.

FIG. 4 shows a graph comparing the number of wiper transistors used in the conventional approach to the number of wiper transistors used in the new approach. The graph indicates the exponential reduction of overhead circuitry including the wiper transistors with the new approach.

TABLE 2

| Resistor Taps | No. of unit size resistor elements (prior art) | Total No. of transistors - wiper transistors only (prior art) | No. of resistor elements (new approach) | No. of Pass transistors | Total No. of Wiper and pass transistors (new approach) | Total No. of Unit size Resistor elements |
|---|---|---|---|---|---|---|
| 22 | 21 | 22 | 12 | 7 | 13 | 56 |
| 32 | 31 | 32 | 16 | 9 | 17 | 83 |
| 64 | 63 | 64 | 20 | 11 | 21 | 168 |
| 128 | 127 | 129 | 24 | 13 | 25 | 339 |
| 256 | 255 | 256 | 28 | 15 | 29 | 680 |
| 1024 | 1023 | 1024 | 36 | 19 | 37 | 2728 |

Figure 5:
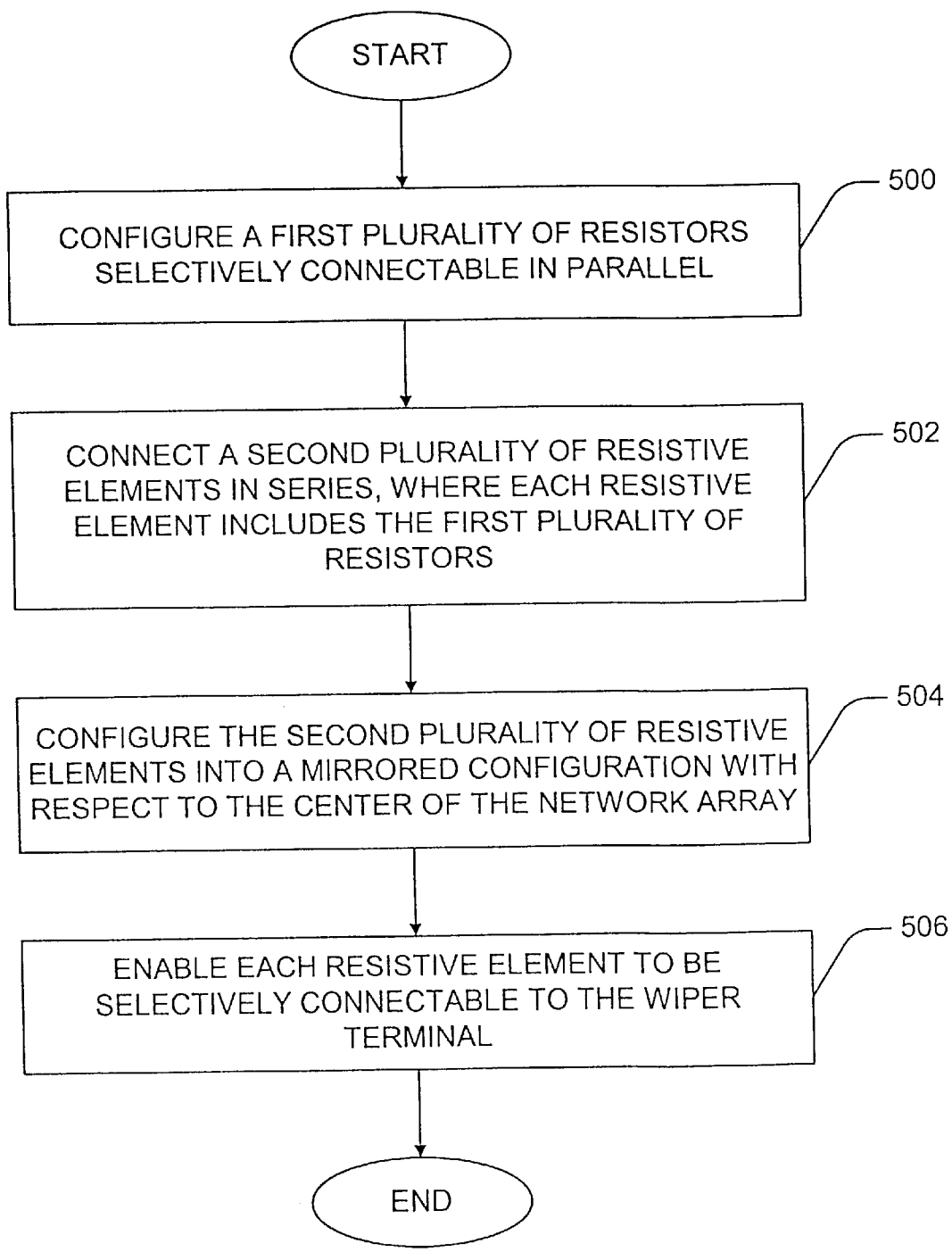
FIG. 5 illustrates a new method for configuring an impedance network array in accordance with an embodiment of the present invention.

A new method for configuring an impedance network array in accordance with an embodiment of the present invention is illustrated in FIG. 5. The method includes configuring a first plurality of resistors selectively connectable in parallel, at 500. The resistors are selectively enabled to connect in parallel with switching elements. These resistors in parallel are of equal values. At 502, a second plurality of resistive elements is connected in series, where each resistive element includes equivalent resistance formed by the first plurality of resistors. Moreover, the resistor values in different resistive elements of the second plurality of resistive elements are selected to be of different values. Furthermore, the second plurality of resistive elements are configured into a mirrored configuration with respect to the center of the network array, at 504. Each resistive element is then enabled to be selectively connectable to the wiper terminal, at 506.

There has been disclosed herein embodiments for an impedance network having a plurality of serially connected resistive pairs, where each pair is connected in parallel. The resistors in parallel are of equal values, while the resistor pairs in series are of unequal values.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the embodiments may be practiced without some of these specific details. For example, although the resistors in parallel are equal while the resistors in series are unequal, different combinations of equal- and unequal-valued resistors may be similarly configured to form the impedance network. For another example, although the present embodiments are described in terms of forming a potentiometer, other circuits such as a digital-to-analog converter (DAC) may also be formed. In other instances, well-known structures and functions were not described in elaborate detail in order to avoid obscuring the subject matter of the present invention. Accordingly, the scope and spirit of the invention should be judged in terms of the claims which follow.

What is claimed is:

1. A resistance network comprising:
   a first set of series-connected branches situated between first and second terminals, wherein said branches respectively comprises a first set of resistive elements connected in series with a first set of switching elements;
   a second set of series-connected branches situated between said first and second terminals, wherein said branches respectively comprises a second set of resistive elements, and wherein said second set of series-connected branches are respectively connected in parallel with said first set of series-connected branches; and
   a second set of switching elements connected between a third terminal and respectively to a set of nodes common to said first and second sets of series-connected branches.

2. The resistance network of claim 1, wherein said first set of resistive elements comprises respectively resistors.

3. The resistance network of claim 2, wherein said second set of resistive elements comprises respectively resistors.

4. The resistance network of claim 3, wherein said first set of switching elements comprises respectively transistors.

5. The resistance network of claim 4, wherein said transistors comprises respectively field effect transistors.

6. The resistance network of claim 1, wherein said second set of switching elements comprises respectively transistors.

7. The resistance network of claim 6, wherein said transistors comprises respectively field effect transistors.

8. The resistance network of claim 1, wherein said first set of resistive elements have different resistances which are symmetrical about a center node of said set of nodes.

9. The resistance network of claim 1, wherein said second set of resistive elements have different resistances which are symmetrical about a center node of said set of nodes.

10. An impedance network comprising:
a first set of series-connected branches situated between first and second terminals, wherein said branches respectively comprises a first set of impedance elements connected in series with a first set of switching elements;
a second set of series-connected branches situated between said first and second terminals, wherein said branches respectively comprises a second set of impedance elements, and wherein said second set of series-connected branches are respectively connected in parallel with said first set of series-connected branches; and
a second set of switching elements connected between a third terminal and respectively to a set of nodes common to said first and second sets of series-connected branches.

11. The impedance network of claim 10, wherein said first set of impedance elements comprises respectively inductors.

12. The impedance network of claim 10, wherein said first set of impedance elements comprises respectively capacitors.

13. The resistance network of claim 10, wherein said second set of impedance elements comprises respectively inductors.

14. The resistance network of claim 10, wherein said second set of impedance elements comprises respectively capacitors.

15. The resistance network of claim 10, wherein said first set of impedance elements have different impedances which are symmetrical about a center node of said set of nodes.

16. The resistance network of claim 10, wherein said second set of resistive elements have different impedances which are symmetrical about a center node of said set of nodes.

17. A method comprising:
providing a first set of series-connected branches situated between first and second terminals, wherein said branches respectively comprises a first set of impedance elements connected in series with a first set of switching elements;
providing a second set of series-connected branches situated between said first and second terminals, wherein said branches respectively comprises a second set of impedance elements, and wherein said second set of series-connected branches are respectively connected in parallel with said first set of series-connected branches;
providing a second set of switching elements connected between a third terminal and respectively to a set of nodes common to said first and second sets of series-connected branches; and
forming a first desired resistance between said first terminal and said third terminal by activating a first combination of switching elements of said first set of switching elements, and activating a second combination of switching elements of said second set of switching elements.

18. The method of claim 17, forming a second desired resistance between said first and second terminals by activating said first combination of switching elements of said first set of switching elements, and activating said second combination of switching elements of said second set of switching elements.

19. The method of claim 18, forming a third desired resistance between said first terminal and said third terminal by activating a third combination of switching elements of said first set of switching elements that is different than said first combination, and/or activating a fourth second combination of switching elements of said second set of switching elements that is different than said second combination.

20. The method of claim 19, forming a fifth desired resistance between said first and second terminals by activating said third combination of switching elements of said first set of switching elements, and/or activating said fourth combination of switching elements of said second set of switching elements.

* * * * *